(12) United States Patent
Chen et al.

(10) Patent No.: US 7,875,965 B2
(45) Date of Patent: Jan. 25, 2011

(54) SEMICONDUCTOR CHIP PACKAGE

(75) Inventors: Nan-Jang Chen, Hsinchu (TW); Hong-Chin Lin, Taichung (TW)

(73) Assignee: Mediatek Inc., Hsin-Chu (TW)

( * ) Notice: Subject to any disclaimer, the term of this patent is extended or adjusted under 35 U.S.C. 154(b) by 150 days.

(21) Appl. No.: 12/050,210

(22) Filed: Mar. 18, 2008

(65) Prior Publication Data
US 2009/0236709 A1  Sep. 24, 2009

(51) Int. Cl.
H01L 23/495 (2006.01)
(52) U.S. Cl. .................. 257/676; 257/666; 257/668; 257/E23.004; 257/E23.031; 257/E23.043; 257/E23.046; 257/E23.052; 438/123; 438/380
(58) Field of Classification Search ............. 257/676, 257/666, E23.004, E23.031, E23.043, E23.046, 257/668; 438/E23.052, 380, 123
See application file for complete search history.

(56) References Cited

U.S. PATENT DOCUMENTS

| | | | |
|---|---|---|---|
| 5,389,816 A | 2/1995 | Shimizu et al. | |
| 5,508,556 A | 4/1996 | Lin | |
| 5,789,811 A | 8/1998 | Chia et al. | |
| 5,818,105 A | 10/1998 | Kouda | |
| 5,920,116 A * | 7/1999 | Umehara et al. | 257/669 |
| 5,933,710 A | 8/1999 | Chia et al. | |
| 2003/0214023 A1 | 11/2003 | Uchida | |
| 2008/0303124 A1* | 12/2008 | Khan et al. | 257/675 |

FOREIGN PATENT DOCUMENTS

| | | |
|---|---|---|
| CN | 1098557 | 2/1995 |
| CN | 2585407 | 11/2003 |
| EP | 0617464 B1 | 5/2002 |
| JP | 61014731 | 2/1986 |
| JP | 4245466 | 9/1992 |
| JP | 7297348 | 11/1995 |
| JP | 2000058739 | 2/2000 |

OTHER PUBLICATIONS

English abstract of CN1098557A, pub. Feb. 8, 1995.
English language translation of abstract of CN 2585407 (published Nov. 5, 2003).
European Search Report dated Sep. 14, 2010.
English language translation of abstract of JP 61014731 (published Jan. 22, 1986).
English language translation of abstract of JP 4245466 (published Sep. 2, 1992).
English language translation of abstract of JP 7297348 (published Nov. 10, 1995).
English language translation of abstract of JP 2000058739 (published Feb. 25, 2000).

* cited by examiner

Primary Examiner—Long K Tran
(74) Attorney, Agent, or Firm—Thomas, Kayden, Horstemeyer & Risley

(57) ABSTRACT

A semiconductor chip package is disclosed. The semiconductor chip package comprises a lead frame having a chip carrier, wherein the chip carrier has a first surface and an opposite second surface. A semiconductor chip is mounted on the first surface, having a plurality of bonding pads thereon, wherein the semiconductor chip has an area larger than that of the chip carrier. A package substrate comprises a central region attached to the second surface, having an area larger than that of the semiconductor chip, wherein some of the bonding pads of the semiconductor chip are electrically connected to a marginal region of the package substrate.

25 Claims, 7 Drawing Sheets

US 7,875,965 B2

SEMICONDUCTOR CHIP PACKAGE

BACKGROUND OF THE INVENTION

1. Field of the Invention

The present invention relates to a semiconductor chip package, and more particularly, relates to a semiconductor chip package with an increased amount of input/output connections.

2. Description of the Related Art

For semiconductor chip package design, an increased amount of input/output connections for multi-functional chips is required. For a conventional lead frame based semiconductor package, however, the amount of leads for input/output connections of a semiconductor chip are limited. To solve the aforementioned problem, a ball grid array (BGA) semiconductor package has been developed to provide a greater amount of input/output connections through solder balls on the bottom of a package substrate of the semiconductor chip package. Requirements for increased input/output connections can be achieved through a finer ball pitch. Compared with the conventional lead frame based semiconductor package, however, the BGA semiconductor package suffers from poorer yields and higher fabricating costs due to the additional electrical connections to the solder balls.

A novel semiconductor chip package with an increased amount of input/output connections and fabricating cost between the fabricating cost for lead frame and BGA semiconductor packages is desirable.

BRIEF SUMMARY OF INVENTION

A semiconductor chip package is provided. An exemplary embodiment of the semiconductor chip package comprises a lead frame having a chip carrier, wherein the chip carrier has a first surface and an opposite second surface. A semiconductor chip is mounted on the first surface, having a plurality of bonding pads thereon, wherein the semiconductor chip has an area larger than that of the chip carrier. A package substrate comprising a central region attached to the second surface, has an area larger than that of the semiconductor chip, wherein some of the bonding pads of the semiconductor chip are electrically connected to a marginal region of the package substrate.

Another exemplary embodiment of the semiconductor chip package comprises a lead frame having a chip carrier. A semiconductor chip is mounted on a side of the chip carrier, having a plurality of bonding pads thereon, wherein the semiconductor chip has an area larger than that of the chip carrier. A package substrate is attached on an opposite side of the chip carrier, having an area larger than that of the semiconductor chip, wherein some of the bonding pads of the semiconductor chip are electrically connected to a top surface of the package substrate, which faces the chip carrier.

Yet another exemplary embodiment of the semiconductor chip package comprises a lead frame having a chip carrier and leads. A semiconductor chip is mounted on one side of the chip carrier, having a plurality of bonding pads thereon. A package substrate has a top surface attached on an opposite side of the chip carrier, wherein the chip carrier has an area smaller than that of the semiconductor chip and the package substrate. Some of the bonding pads are electrically connected to the top surface of the package substrate, and the remaining bonding pads are electrically connected to the leads, respectively.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF INVENTION

Figure 1A:
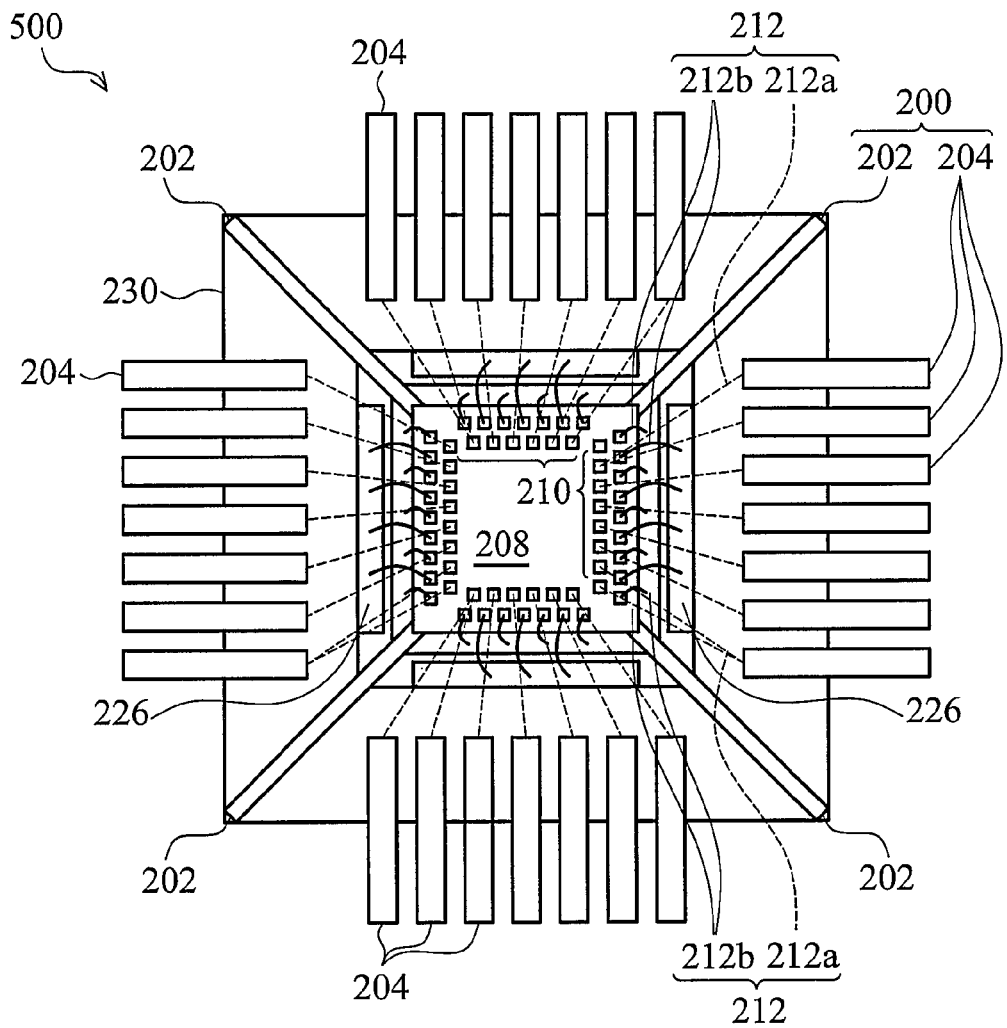
FIG. 1a shows a top view of one exemplary embodiment of a semiconductor chip package of the invention.

The following description is of a mode of carrying out the invention. This description is made for the purpose of illustrating the general principles of the invention and should not be taken in a limiting sense. The scope of the invention is best determined by reference to the appended claims. Wherever possible, the same reference numbers are used in the drawings and the descriptions to refer the same or like parts.

Figure 1B:
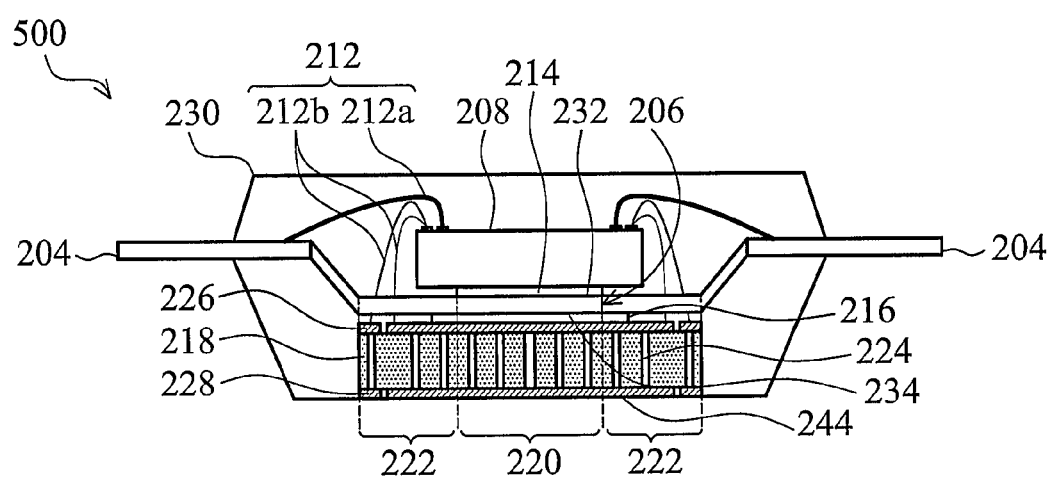
FIG. 1b shows a cross section of one exemplary embodiment of a semiconductor chip package of the invention.
Figure 2:
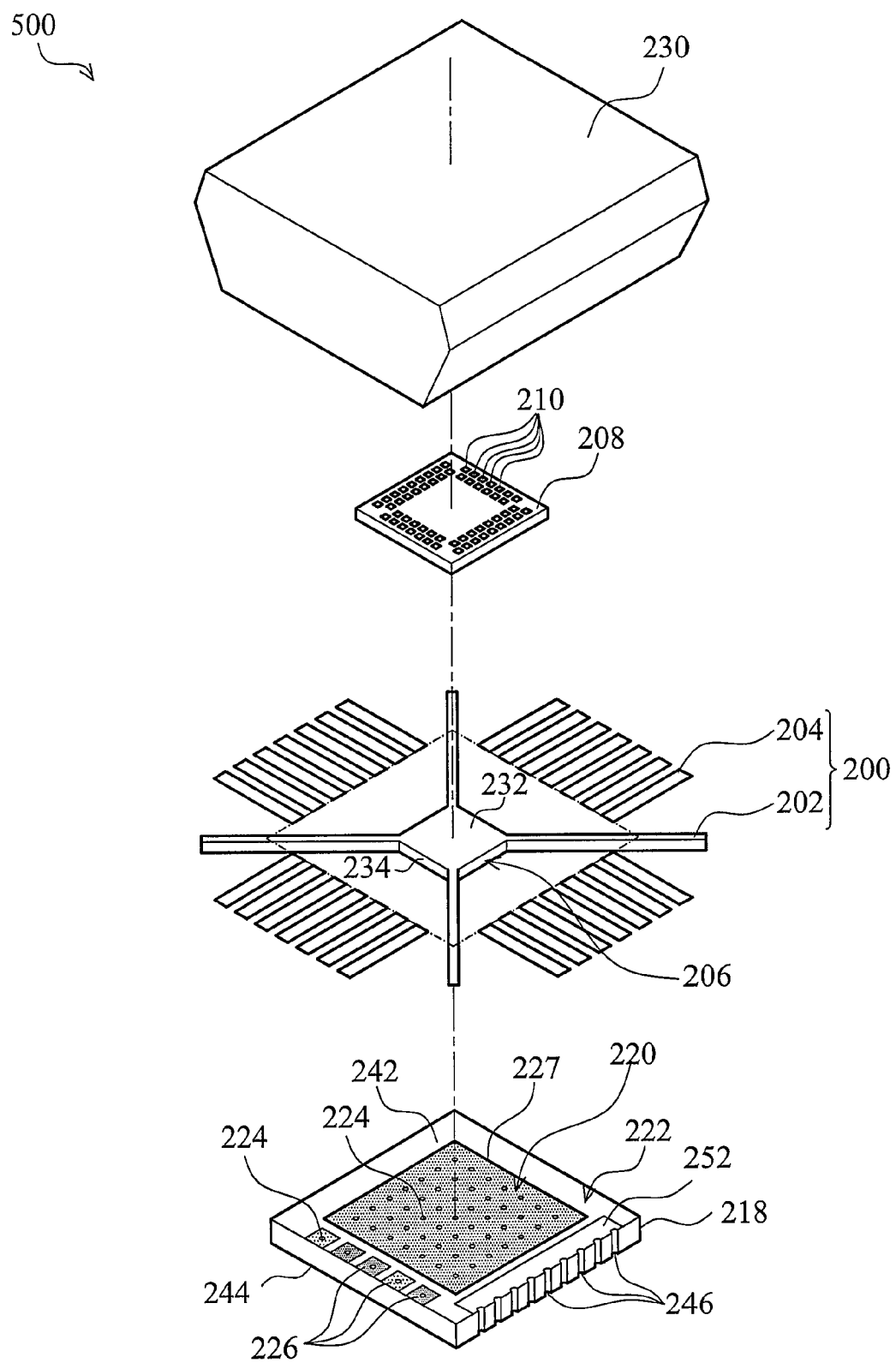
FIG. 2 shows an assembly diagram of an exemplary embodiment of a semiconductor chip package of the invention.

In accordance with an embodiment of the present invention, embodiments of a semiconductor chip package are provided. FIGS. 1a and 1b show one exemplary embodiment of the semiconductor chip package 500 of the invention. FIG. 2 shows an assembly diagram of an exemplary embodiment of the semiconductor chip package 500. In one embodiment of the invention, semiconductor chip package 500 may comprise a low-profile quad flat package (LQFP). Semiconductor chip package 500 comprises a lead frame 200 comprising a plurality of discrete leads 204, supporting bonds 202 and a chip carrier 206. Chip carrier 206 is disposed in a central portion of lead frame 200, electrically connecting to supporting bonds 202. Chip carrier 206 has a first surface 232 and an opposite second surface 234.

A semiconductor chip 208 is mounted on the first surface 232 by an adhesive material 214. Semiconductor chip 208 has a plurality of bonding pads 210 thereon. In one embodiment of the invention, the bonding pads 210 may be positioned to adjacent edges of the semiconductor chip 208 as shown in FIG. 1a. As shown in FIGS. 1a and 1b, the semiconductor chip 208 may have an area larger than that of the chip carrier 206.

A package substrate 218 comprises a central region 220 and a marginal region 222, wherein central region 220 is attached to a second surface 234 of the chip carrier 206 by an adhesive material 216, leaving the marginal region 222 exposed through the chip carrier 206. In one embodiment of the invention, the package substrate 218 may comprise a ball grid array (BGA) substrate. The package substrate 218 has a top surface 242 and a bottom surface 244, wherein the top surface 242 faces a second surface 234 of the chip carrier 206. In one embodiment of the invention, package substrate 218 may have an area larger than that of the semiconductor chip 208. A plurality of conductive planes 226, 227 and 252 may be formed on the top surface 242 in the marginal region 222, and a conductive plane 227 may be formed on the top surface 242 in the central region 220. A plurality of vias 224 are drilled through the package substrate 218, wherein some of the vias 224 are electrically connected to conductive planes 226, 227 and 252. The semiconductor chip package 500 may further comprise recesses 246 at an edge of the package substrate 218, through the package substrate 218. The recesses 246 may be positioned in the conductive plane 252. As shown in FIG. 1b, a plurality of ball pads 228 on a bottom surface 244 of the package substrate 218, is electrically connected to the vias 224. In one embodiment of the invention, each of conductive planes 226, 227 and 252 may be electrically connected to the corresponding ball pad 228 through vias 224, respectively. The semiconductor chip package 500 may further comprise solder balls (not shown) formed on the ball pads 228 to provide interconnection to an underlying printed circuit board (PCB) (not shown) of a final product.

As shown in FIGS. 1a and 1b, some of the bonding pads 210, for example, bonding pads 210 positioned adjacent to edges of the semiconductor chip 208, are electrically connected to conductive planes 226 in the marginal region 222 of the package substrate 218 by bonding wires 212a, respectively. And the remaining bonding pads 210, for example, bonding pads 210 positioned away from the semiconductor chip 208, are electrically connected to the leads 204 by bonding wires 212a, respectively. For electrical connections of bonding wires 212b between the semiconductor chip 208 and the package substrate 218, chip carrier 206 may have an area smaller than that of the semiconductor chip 208 and the package substrate 218, and the package substrate 218 may have an area larger than that of the semiconductor chip 208. A covering material 230 may encapsulate the semiconductor chip 208, an inner portion of lead frame 200 and a portion of the package substrate 218 by such as mold filling, leaving the bottom surface 244 of the package substrate 218 exposed from the covering material 230.

Figure 3A:
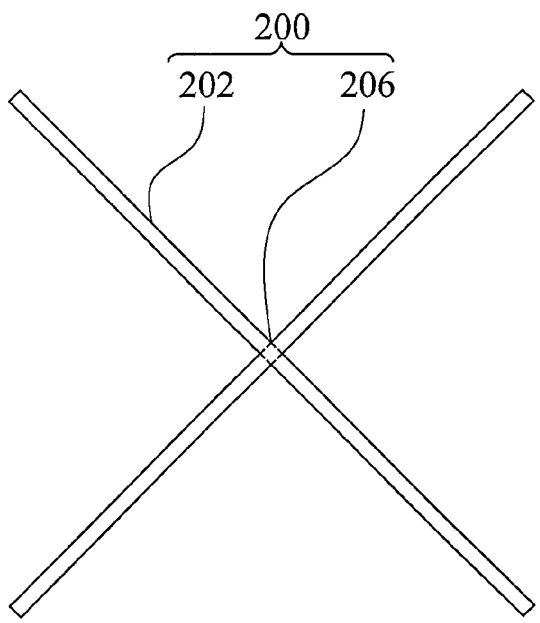
FIGS. 3a to 3e are lead frames showing various designs of the chip carrier.
Figure 3B:
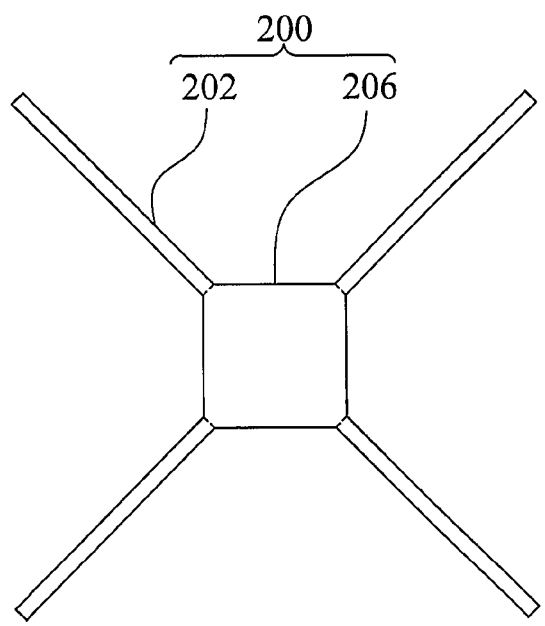
Figure 3C:
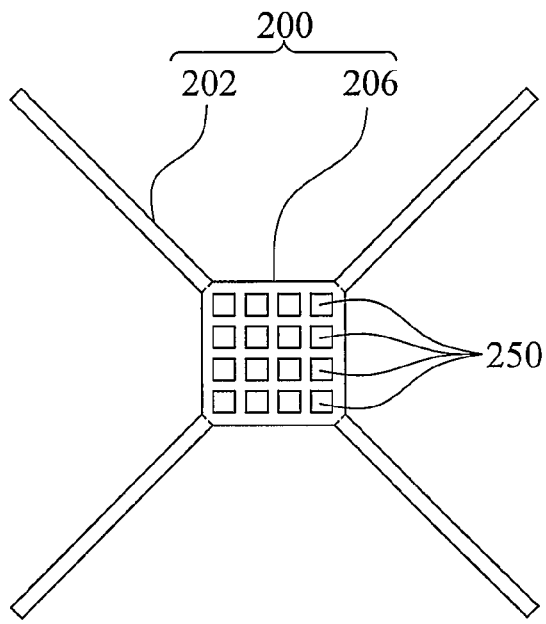
Figure 3D:
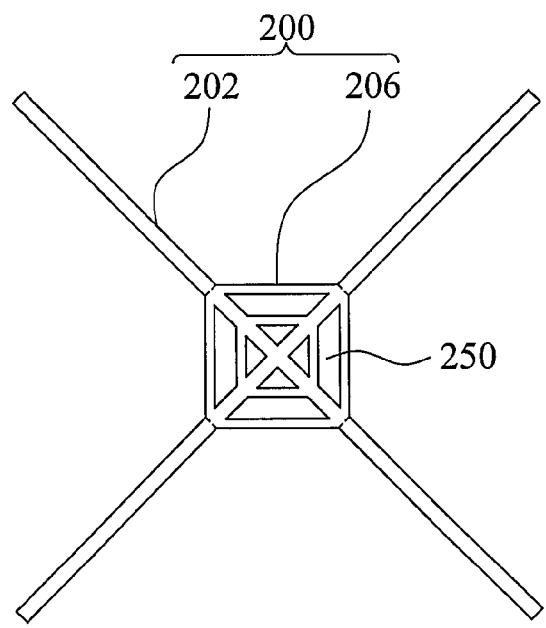
Figure 3E:
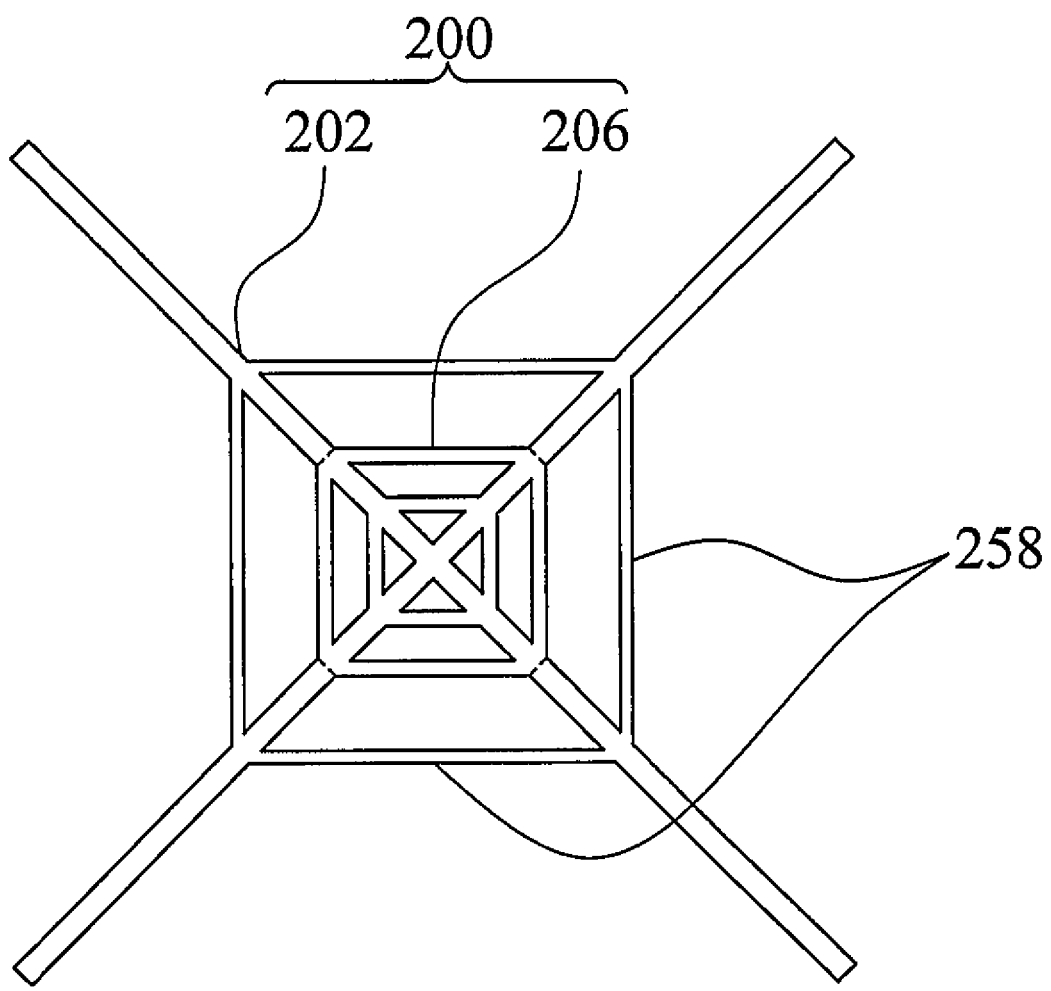

FIGS. 3a to 3e are lead frames showing various designs of the chip carrier 206 of lead frame 200 to optimized adhesive strength among semiconductor chip 208, chip carrier 206 and the package substrate 218. As shown in FIG. 3a, chip carrier 206 may be an intersection area of the supporting bonds 202. Chip carrier 206 may have a square shape as shown in FIG. 3b. In some embodiments of the invention, chip carrier 206 may have holes 250 formed inside of the chip carrier 206 as show in FIGS. 3c to 3e. Alternatively, additional supporting bonds 258 may be formed outside of the chip carrier 206, connected to supporting bonds 202, to improve adhesive strength between the chip carrier 206 and the package substrate 218. The holes 250 may have various kinds of shapes, for example, square, ladder, circle or the like, which are dependent upon design requirements, and is not limited.

Figure 4A:
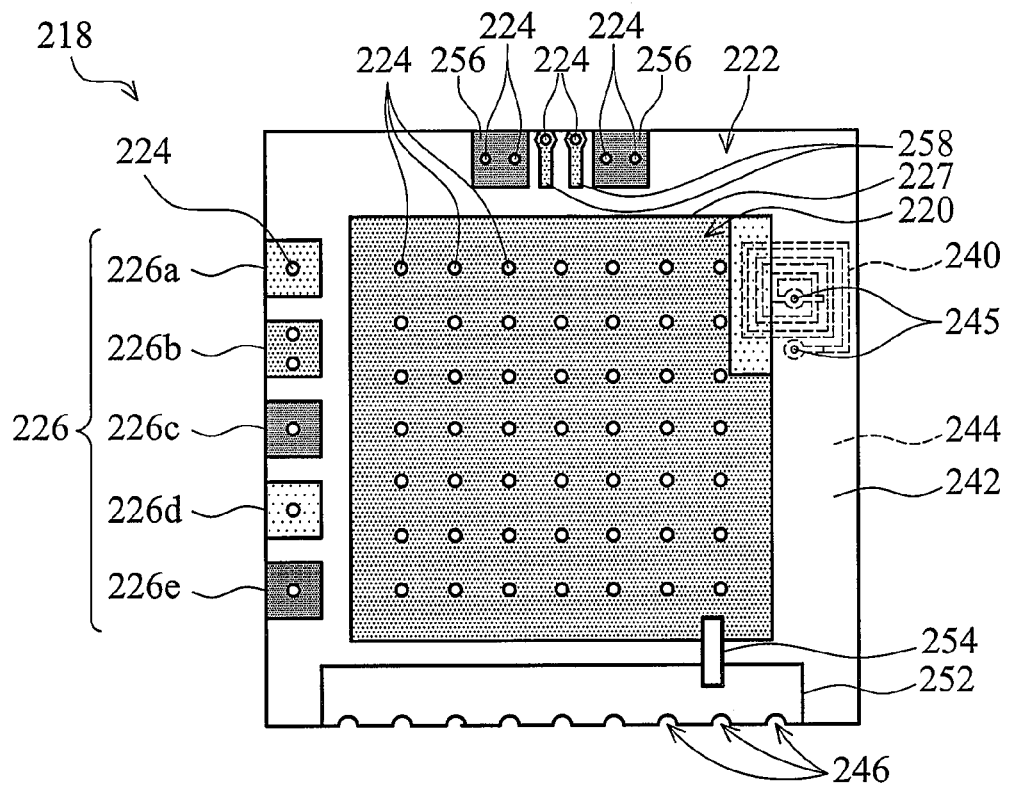
FIG. 4a shows a top view of one exemplary embodiment of a substrate of a semiconductor chip package of the invention.
Figure 4B:
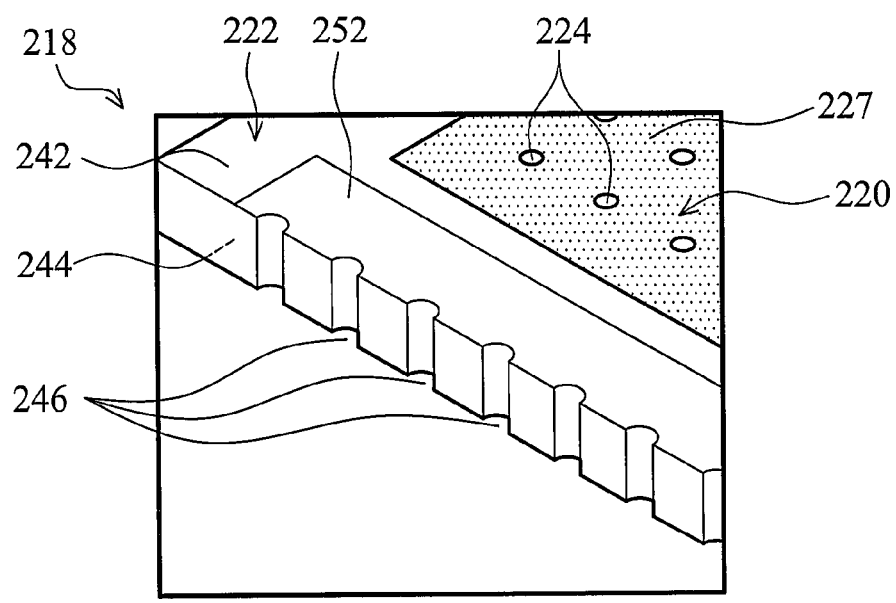
FIG. 4b illustrates an enlarged view of a portion of FIG. 4A.

FIGS. 4a and 4b show one exemplary embodiment of a package substrate 218 design of a semiconductor chip package of the invention. The package substrate 218 not only provides amount of input/output connections of the semiconductor chip 208, but also serves as a heat sink for the semiconductor chip 208. The package substrate 218 may comprise a central region 220 and a marginal region 222. The central region 220 on the top surface 242 of the package substrate 218 is attached to and electrically connected to the second surface 234 of the chip carrier 206, having a conductive plane 227 thereon. In one embodiment of the invention, the central region 220 of the package substrate 218 may provide ground paths of the semiconductor chip 208, such as, ground paths of digital circuits. Also, the vias 224 in the central region 220 may be used to reduce thermal resistance. Also, a plurality of conductive planes 226, 252, 256 and 258 may be disposed on the top surface 242 in the marginal region 222 of the package substrate 218, electrically connecting to some bonding pads 210 of the semiconductor chip 208 as shown in FIG. 1a, respectively. In one embodiment of the invention, the conductive planes 226 and 252 may provide multiple power and/or ground paths of the semiconductor chip 208, such as, power and/or ground paths of analog circuits. A plurality of vias 224 is drilled through the package substrate 218, wherein some of vias 224 are electrically connected to the conductive planes 226, 227, 256 and 258. Each of conductive planes 226, 227, 256 and 258 may be electrically connected to a corresponding ball pad 228 (of FIG. 1b) on the bottom surface 244 through the vias 224, respectively.

Additionally, conductive planes 256 and 258 of the package substrate 218 may provide device interface connections for transmitting data, for example, universal serial bus (USB), high definition multimedia interface (HDMI), serial advanced technology attachment (SATA) or the like. As shown in FIG. 4a, the conductive planes 256 and 258 in the marginal region 222 may serve differential net planes and impedance control planes of device interfaces, respectively. Compared with the conventional lead frame based semiconductor package, length of the bonding wires for input/output connections of the semiconductor chip 208 can be reduced to have better electrical performances, such as, reduced resistance and inductance.

Further, a plurality of electrical components 240 and 254 may be disposed on the package substrate 218, electrically connecting to some of the bonding pads 210 through bonding wires 212b and vias 224 as shown in FIGS. 1a and 1b. The aforementioned electrical components 240 and 254 may comprise passive components comprising power rings, ground rings, capacitors, resistors or inductors. For example, the electrical component 240, may serve as a spiral inductor trace, and be disposed on the bottom surface 244 of the package substrate 218, electrically connecting the bonding pads 210 through the vias 245 and bonding wires 212b as shown in FIGS. 1a and 1b. As the inductor 240 normally cannot be seen from a top view, the inductor 240 is profiled by dashed lines in FIG. 4a. Additionally, electrical component 254, may serve as a de-coupling capacitor, and may be disposed on the top surface 242 between a ground plane and a power plane, for example, conductive planes 227 and 252. The de-coupling capacitor 254 may be used to reduce noise generated by circuits. Compared with a conventional lead frame based semiconductor package, the package substrate 218 may provide additional electrical connections for the semiconductor chip 208, for example, power and/or ground paths. The package substrate 218 may also provide an area for electrical components, for example, power rings, ground rings, capacitors, resistors or inductors, to be disposed thereon. Some electrical performances, for example, power circuit inductance or ground circuit inductance, can be improved. Compared with the conventional ball grid array semiconductor package, package substrate 218 may have simple layout, for example, large power and ground planes without fine pitch traces. Therefore, fabricating cost can be reduced and yield can be improved.

FIG. 4b illustrates an enlarged view of a portion of FIG. 4A. In one embodiment of the invention, the recesses 246 may be designed at an edge of the package substrate 218, through the package substrate 218. The recesses 246 may be formed by firstly drilling holes (not shown) in the package substrate 218, and then sawing package substrate 218 through the holes. The recesses 246 may be positioned in conductive plane 252 as shown in FIG. 4b. The recesses 246 may provide additional electrical connection paths to the top surface 242 and bottom surface 244. Also, the recesses 246 may increase surface roughness of the package substrate 218. Therefore, bonding strength between the covering material 230 and the resulting package substrate 218 can be improved.

Figure 5:
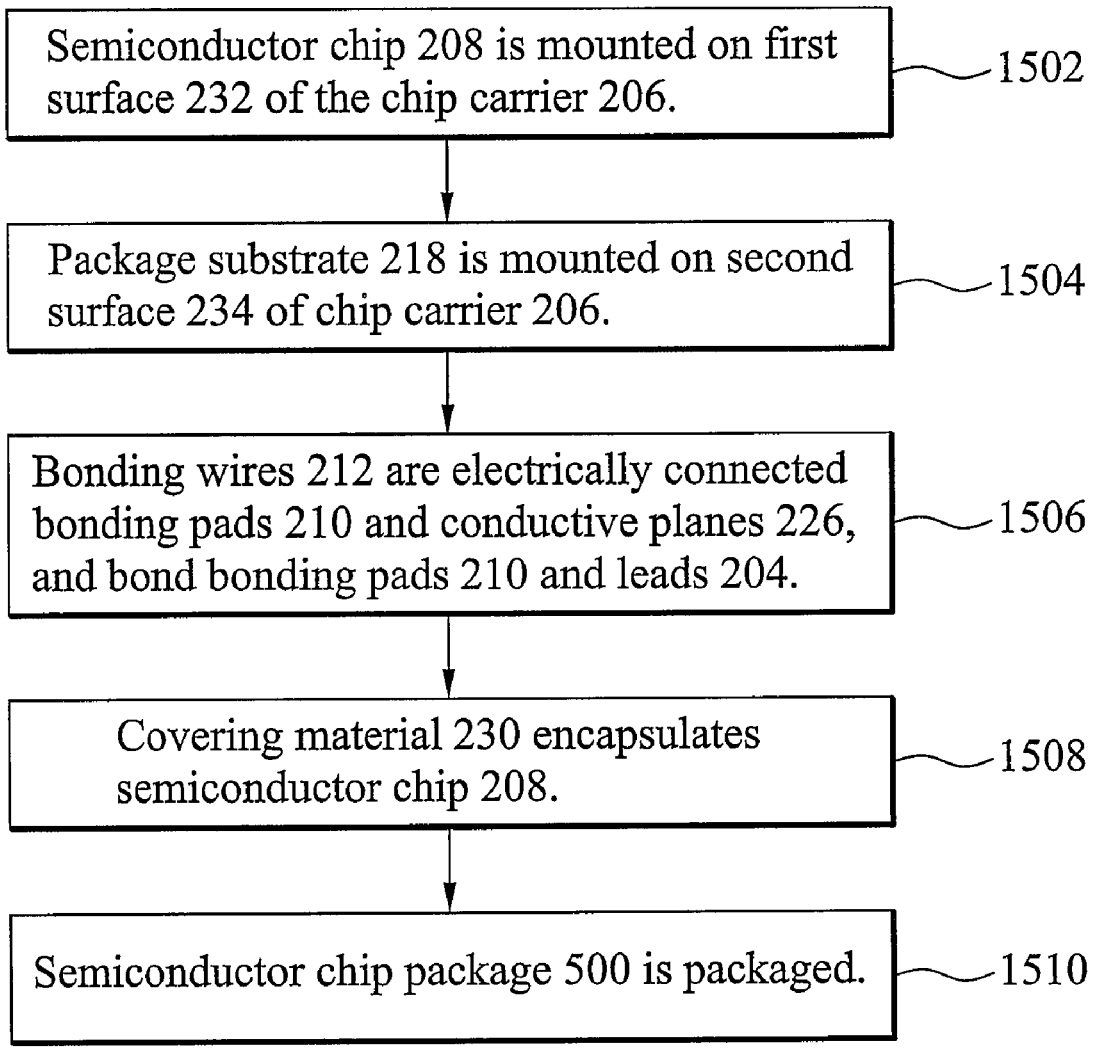
FIG. 5 is a flow diagram showing a fabricating process for assembly of a semiconductor chip package of the invention.

FIG. 5 is a flow diagram showing a fabricating process for assembly of a semiconductor chip package 500 of the invention. As shown in step 1502, the step of assembly of a semiconductor chip package 500 comprises mounting a semiconductor chip 208 on a first surface 232 of the chip carrier 206 by adhesive material 214. As shown in step 1504, the central region 220 of the package substrate 218 is mounted on the second surface 234 of the chip carrier 206 by an adhesive material 216, leaving the marginal region 222 exposed through the chip carrier 206. As shown in step 1506, some bonding wires 212 are electrically connected to the bonding pads 210 and conductive planes 226 in the marginal region 222 of the package substrate 218. The remaining bonding wires 212 bond the bonding pads 210 and leads 204. As shown in step 1508, the covering material 230 encapsulates the semiconductor chip 208, an inner portion of lead frame 200 and a portion of the package substrate 218 by molding, leaving the bottom surface 244 of the package substrate 218 exposed from the covering material 230. As shown in step 1510, the resulting semiconductor chip package 500 is packaged for product delivery.

The semiconductor chip package 500 is illustrated. Some advantages of an exemplary embodiment of the semiconductor chip package 500 of the invention are described in the following. The package substrate 218 not only serves as a heat sink for the semiconductor chip 208, but also provides amount of input/output connections of the semiconductor chip 208. Compared with the conventional lead frame based semiconductor package, the package substrate 218 may provide additional electrical connections for the semiconductor chip 208, for example, power and/or ground paths. The package substrate 218 may also provide an area for electrical components, for example, power rings, ground rings, capacitors, resistors or inductors, to be disposed thereon. Some electrical performances, for example, power circuit inductance or ground circuit inductance, can be improved. Compared with the conventional ball grid array semiconductor package, package substrate 218 may have simple layout. Therefore, fabricating cost can be reduced and yield can be improved. The vias 224 in the central region 220 may be used for reducing thermal resistance. The chip carrier 206 of the lead frame 200 may have various designs to optimized adhesive strength among the semiconductor chip 208, chip carrier 206 and the package substrate 218.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor chip package, comprising:
    a lead frame having a chip carrier and a plurality of leads, wherein the chip carrier has a first surface and an opposite second surface;
    a semiconductor chip mounted on the first surface, having a plurality of bonding pads thereon, wherein the semiconductor chip has an area larger than that of the chip carrier; and
    a package substrate comprising a central region attached to the second surface, having an area larger than that of the semiconductor chip, wherein some of the bonding pads of the semiconductor chip are electrically connected to a marginal region of the package substrate, wherein the package substrate is free from overlapping the leads of the lead frame from a top view.

2. The semiconductor chip package as claimed in claim 1, wherein some of the bonding pads of the semiconductor chip are electrically connected to a top surface of the package substrate, which faces the second surface of the chip carrier.

3. The semiconductor chip package as claimed in claim 2, further comprising:
    a plurality of conductive planes on the top surface in the marginal region, electrically connected to the bonding pads of the semiconductor chip;
    a plurality of vias drilled through the package substrate, wherein some of the vias are electrically connected to the conductive planes; and
    a plurality of electrical components on the package substrate, electrically connected to some of the bonding pads.

4. The semiconductor chip package as claimed in claim 3, further comprising a recess at an edge of the package substrate, positioned in one of the conductive planes.

5. The semiconductor chip package as claimed in claim 3, wherein the conductive planes comprise power planes or ground planes.

6. The semiconductor chip package as claimed in claim 3, wherein the electrical components comprise power rings, ground rings, inductor traces, capacitors, resistors, diodes or inductors.

7. The semiconductor chip package as claimed in claim 1, wherein the at least one lead of the lead frame is electrically connected to the bonding pad, respectively.

8. The semiconductor chip package as claimed in claim 1, further comprising holes formed inside of the chip carrier.

9. The semiconductor chip package as claimed in claim 1, further comprising:
    a covering material encapsulating the semiconductor chip, an inner portion of the lead frame and a portion of the package substrate, leaving a bottom surface of the package substrate exposed from the covering material.

10. A semiconductor chip package, comprising:
    a lead frame having a chip carrier and a plurality of leads ;
    a semiconductor chip mounted on a side of the chip carrier, having a plurality of bonding pads thereon, wherein the semiconductor chip has an area larger than that of the chip carrier; and
    a package substrate attached on an opposite side of the chip carrier, having an area larger that that of the semiconductor chip, wherein some of the bonding pads of the semiconductor chip are electrically connected to a top surface of the package substrate, which faces the chip carrier, wherein the package substrate is free from overlapping the leads of the lead frame from a top view wherein the package substrate is free from overlapping the leads of the lead frame from a top view.

11. The semiconductor chip package as claimed in claim 10, wherein the at least one lead of the lead frame is electrically connected to the corresponding bonding pad, respectively.

12. The semiconductor chip package as claimed in claim 10, further comprising holes formed inside of the chip carrier.

13. The semiconductor chip package as claimed in claim 10, further comprising:
    a plurality of conductive planes on the top surface of the package substrate, electrically connected to the semiconductor chip;

a plurality of vias drilled through the package substrate, wherein some of the vias are electrically connected to the conductive planes; and a plurality of electrical components on the package substrate, electrically connected to some of the bonding pads.

14. The semiconductor chip package as claimed in claim 13, further comprising a recess at an edge of the package substrate, positioned in one of the conductive planes.

15. The semiconductor chip package as claimed in claim 13, wherein the conductive planes comprise power planes or ground planes.

16. The semiconductor chip package as claimed in claim 13, wherein the electrical components comprise power rings, ground rings, inductor traces, capacitors, resistors, diodes or inductors.

17. The semiconductor chip package as claimed in claim 10, further comprising:

a covering material encapsulating the semiconductor chip, an inner portion of the lead frame and a portion of the package substrate, leaving a bottom surface of the package substrate exposed from the covering material.

18. A semiconductor chip package, comprising:

a lead frame having a chip carrier and leads;

a semiconductor chip mounted on one side of the chip carrier, having a plurality of bonding pads thereon; and a package substrate having a top surface attached on an opposite side of the chip carrier, wherein the chip carrier has an area smaller than that of the semiconductor chip and the package substrate, some of the bonding pads are electrically connected to the top surface of the package substrate, and the remaining bonding pads are electrically connected to the leads, respectively, wherein the package substrate is free from overlapping the leads of the lead frame from a top view.

19. The semiconductor chip package as claimed in claim 18, wherein some of the bonding pads are electrically connected to a marginal region of the package substrate, and the marginal region is not attached to the chip carrier.

20. The semiconductor chip package as claimed in claim 18, further comprising holes formed inside of the chip carrier.

21. The semiconductor chip package as claimed in claim 18, further comprising:

a plurality of conductive planes on the top surface of the package substrate, electrically connected to the semiconductor chip;

a plurality of vias drilled through the package substrate, wherein some of the vias are electrically connected to the conductive planes; and a plurality of electrical components on the package substrate, electrically connected to some of the bonding pads.

22. The semiconductor chip package as claimed in claim 21, further comprising a recess at an edge of the package substrate, positioned in one of the conductive planes.

23. The semiconductor chip package as claimed in claim 21, wherein the conductive planes comprise power planes or ground planes.

24. The semiconductor chip package as claimed in claim 21, wherein the electrical components comprise power rings, ground rings, inductor traces, capacitors, resistors, diodes or inductors.

25. The semiconductor chip package as claimed in claim 18, further comprising:

a covering material encapsulating the semiconductor chip, an inner portion of the lead frame and a portion of the package substrate, leaving a bottom surface of the package substrate exposed from the covering material.

* * * * *